United States Patent [19]

Gambogi, Jr. et al.

[11] Patent Number: 5,182,180
[45] Date of Patent: Jan. 26, 1993

[54] DRY FILM PROCESS FOR ALTERING THE WAVELENGTH OF RESPONSE OF HOLOGRAMS

[75] Inventors: William J. Gambogi, Jr.; Robert G. Melega, both of Wilmington, Del.

[73] Assignee: E. I. Du Pont de Nemours and Company, Wilmington, Del.

[21] Appl. No.: 758,270

[22] Filed: Aug. 27, 1991

[51] Int. Cl.$^5$ .................... G03H 1/04; G03H 1/18
[52] U.S. Cl. ........................... 430/1; 430/2; 430/290; 359/1; 359/3; 359/28
[58] Field of Search ............ 430/1, 2, 290; 359/1, 359/3, 28, 22

[56] References Cited

U.S. PATENT DOCUMENTS

| | | |
|---|---|---|
| 4,173,475 | 5/1977 | Chandross et al. ............ 430/290 |
| 4,759,594 | 7/1988 | Bond et al. ................... 430/1 |
| 4,842,968 | 6/1989 | Kojima et al. ................ 430/1 |
| 4,889,780 | 12/1989 | Cosner ....................... 359/28 |
| 4,913,990 | 10/1987 | Rallison ..................... 359/3 |
| 4,942,102 | 7/1990 | Keys et al. .................. 430/1 |
| 4,959,283 | 9/1990 | Smothers et al. . | |
| 4,989,071 | 1/1991 | Hopwood ..................... 359/28 |
| 5,024,909 | 6/1991 | Smothers et al. ............. 430/1 |

FOREIGN PATENT DOCUMENTS

| | | | |
|---|---|---|---|
| 58-200275 | 11/1983 | Japan ....................... 430/2 |
| 63-287988 | 5/1987 | Japan ....................... 430/2 |

OTHER PUBLICATIONS

T. J. Cvetkovich, "Techniques for the Replication of Multicolor Reflection Holograms", *Proc. SPIE*, 523, 47–51 (1985).

A. M. Weber, et al., "Hologram Recording in Du Pont's New Photopolymer Materials", *Proc. SPIE*, 1212, 30–39 (1990).

*Primary Examiner*—Charles L. Bowers, Jr.
*Assistant Examiner*—Martin J. Angebranndt

[57] ABSTRACT

The process is disclosed for altering the wavelength response of a volume phase reflection hologram by contacting the hologram with a diffusion element containing a monomer. Monomer in the diffusion element is partially polymerized to effect a desired diffusion pattern.

11 Claims, No Drawings

DRY FILM PROCESS FOR ALTERING THE WAVELENGTH OF RESPONSE OF HOLOGRAMS

FIELD OF THE INVENTION

This invention relates to refractive index imaging and, more particularly, to a process for altering the wavelength of response of a volume phase reflection hologram.

BACKGROUND OF THE INVENTION

Volume phase reflection holograms in general only reflect a single wavelength of light and thus produce a monochromatic reconstructed image. To produce multicolor reconstructed images, one must image a series of holograms in the same recording material. This is a difficult and time consuming process.

In one approach, a panchromatic recording material is selected that is sensitive to a broad spectrum of visible radiation. A series of holograms is imaged in the material by exposure to different wavelengths of light. Weber et al., for example, disclose imaging a photopolymer holographic recording material with 647 nm, 528 nm, and 476 nm light to produce a three color holographic mirror in Practical Holography IV, Proc. SPIE, 1212, pp 30-39 (1990). This approach, however, requires incorporation of sensitizing dyes to achieve response to the various wavelengths. Each dye must fade with time, or the dye itself will impart color to the hologram. Also, the intensity of each exposure must be carefully controlled to consume only a portion of the monomer available in the recording material so that monomer will be available for subsequent exposures to create the other colors. Thus, the resulting colored hologram may not be as bright as desired.

In another approach, all exposures are conducted at the same wavelength, with the recording material being progressively swollen or shrunk following each exposure. T. J. Cvetovich, for example, describes a process wherein a recording medium is exposed sequentially to a series of master holograms in Applications of Holography, Proc. SPIE, 523, pp 47-51, 1985. The recording medium is swollen with triethanol amine prior to the first exposure and progressively dried prior to each succeeding exposure. It is difficult to reproducibly process holograms using this approach, however, because of the difficulty of reliably controlling the amount of swelling or shrinkage in wet processing.

In Smothers, U.S. Pat. No. 4,959,283, a process is disclosed for altering the wavelength of response of a hologram. Following exposure and development of the hologram, a dry film diffusion element is laminated to it. Material is allowed to diffuse into or out of the hologram altering its wavelength of response. However, this process only changes the wavelength of response of the entire hologram and does not produce a multicolor hologram.

Thus, there is a continuing need for a practical method for forming multicolor holograms.

SUMMARY OF THE INVENTION

The present invention provides a process for forming a volume phase hologram in a substantially solid, transparent, photosensitive film element comprising (a) holographically exposing the film element to coherent light to record a volume hologram within said element;

(b) exposing a diffusion element containing monomer to actinic radiation to partially polymerize said monomer; and (c) contacting said film element with said diffusion element for a time sufficient to modify the wavelength of light response by the hologram.

The diffusion element may be exposed imagewise to create a half-tone or continuous tone image of residual monomer that migrates into the film element during the contacting step to selectively swell desired portions of the hologram. The process is readily repeated to form multicolored holograms. Alternatively, a diffusion element may be subjected to multiple irradiations that form a desired pattern, of varying monomer concentration, that migrates during the contacting step.

DETAILED DESCRIPTION OF THE INVENTION

The invention provides a process for selectively altering the wavelength of response of a volume phase reflection hologram. A diffusion element containing a monomer, a binder, and a photoinitiator system is laminated to a photosensitive film element after the element has been imaged to record a reflection hologram. The diffusion element is irradiated to polymerize at least a portion of the monomer, thereby controlling the amount of monomer which diffuses into the hologram. Irradiation of the diffusion element may be carried out either before or after the lamination step and may be carried out in an imagewise fashion to selectively alter the response of a portion of the hologram. Multiple irradiations of a single diffusion element or multiple diffusion elements may be used to produce multicolor holograms. Multiple irradiations of a single diffusion element or multiple diffusion elements also may be used to selectively control playback wavelength or diffraction efficiency in selected areas or continuously over selected areas.

Diffusion Element

The diffusion element is a dry film that comprises a monomer, an initiator system, and a binder, on a support. When the diffusion element is laminated to a film element that contains a volume phase reflection hologram, the monomer diffuses into the film element, thereby increasing the wavelength of light reflected by the hologram. The shift is fixed by polymerizing the monomer following diffusion.

Any of the numerous conventional photopolymerizable monomers may be used in the film provided the selected monomer is diffusible into the recording medium and compatible with it. If the holographic recording medium is a photopolymer, the monomer may be the same as that contained in the recording medium, a monomer with a similar refractive index, a totally different monomer, or a mixture of various monomers.

The initiator system may be any of the conventional initiator systems used in photopolymerizable compositions. Examples of such initiator systems are described below. Initiator systems that do not contain a component which absorbs visible radiation may be used to advantage. Diffusion of materials that absorb visible light may impart unwanted color to the final hologram. Initiator systems that do not absorb visible light can not be activated by visible radiation.

The binder may be any of the conventional binders used in photopolymerizable compositions. Examples of such binders are described below. If the film and recording medium have the same binder or if the binder of the film is a compatible transparent material, the diffusion element may be permanently laminated to the photosensitive film to serve as a protective overcoat.

Additional components may be present in the film provided they are compatible with the composition and are either non-diffusible into the recording medium or do not adversely affect the properties of recording medium. For example, the diffusion element may contain plasticizers, thermal stabilizers, coating aids, antihalation agents, and the like that are commonly added to photopolymerizable compositions.

The diffusion element generally has a support. The support may be any dimensionally stable material typically used with photopolymer films. A transparent support is required if irradiation is to be carried out through the support. Preferred support materials are polymer films, such as polyethylene, polypropylene, cellulose, and polyethylene terephthalate film. The element also may have a coversheet to protect it until ready for use. The coversheet generally is a polymer film, such as polyethylene, polypropylene, or polyethylene terephthalate.

The diffusion element may be prepared using conventional coating techniques. The ingredients of the dry film are dissolved in a suitable solvent, coated onto the support, and the solvent evaporated. After the solvent has evaporated, the coversheet is laminated to the dry film. Alternatively, the dry film may be coated onto the coversheet, and the support laminated to the dry film.

In the process of this invention, the diffusion element is irradiated to polymerize at least a portion of the monomer, thereby controlling the amount of monomer that diffuses into the recording medium. Irradiation may be carried out either before and/or after the diffusion element is laminated to the recording medium comprising the hologram. The diffusion element may be uniformly irradiated, or it may be irradiated in an imagewise fashion.

If irradiation is carried out before lamination, the coversheet is typically left in place and irradiation carried out through the support. The coversheet is removed from the diffusion element, and the revealed side of the irradiated diffusion element laminated to the recording medium comprising the hologram.

If irradiation is to be carried out after lamination, the coversheet is removed from the diffusion element, and the revealed side of the diffusion element laminated to the recording medium comprising the hologram. Typically the diffusion element support is left in place following lamination so that it functions as a coversheet for the diffusion element. After it is laminated to the recording medium, the diffusion element is typically irradiated through the diffusion element support. Irradiation may be carried out immediately following lamination before a substantial portion of the monomer has diffused. Alternatively, or additionally, irradiation to stop or limit diffusion may be carried out after a substantial portion of the monomer has diffused.

Alternatively, or additionally, irradiation may be carried out in an imagewise fashion before lamination, immediately following lamination, and/or after a substantial portion of the monomer has diffused. Imagewise irradiation may be conveniently carried out through a half-tone or a continuous tone transparency. Other means of imagewise irradiation include exposure through a transmissive device, such as a liquid crystal display, and exposure using a scanning laser, electron beam, or the like. Imagewise irradiation polymerizes at least a portion of the monomer in the exposed regions of the diffusion element without polymerizing monomer in the unexposed regions. More monomer is available for diffusion from the unexposed regions than from the exposed regions. Following diffusion, the regions of the hologram in contact with the unexposed regions of the diffusion element will be shifted to longer response wavelengths than the regions of the hologram in contact with the exposed regions of the diffusion element.

A similar process, in which unpolymerized monomer in the holographic film diffuses out into the diffusion element, results in a blue shift of the playback wavelength. Patternwise exposure of the diffusion element controls the monomer concentration gradient between the holographic film and diffusion element.

Different regions of the diffusion element may be exposed in such a way that differing amounts of monomer are polymerized in each region. Since differing amounts of monomer will be available to diffuse from each region, each portion of the hologram in contact with each region will be shifted to a different wavelength. In this manner, a multicolor hologram may be produced. Alternatively, or additionally, differing regions of the diffusion element may be irradiated to stop or limit diffusion after differing amounts of diffusion have taken place.

Two or more diffusion elements may be prepared by exposure to irradiation through a continuous or halftone screen. After the first diffusion element has been laminated to the film element, and the desired amount of diffusion has occurred, the diffusion element is removed and the process repeated with the next diffusion element. The diffused monomer may be polymerized after each contact, or after contact with the last diffusion element. A multicolor hologram may be produced in his manner.

Film Element

The film element is a holographic recording medium, i.e., a photosensitive material. Typically, the element also has a substrate that provides dimensional stability to the photosensitive material. In some cases, a coversheet may be present.

Holograms are recorded in materials that produce a spatial pattern of varying refractive index, rather than optical density, when exposed to light. Holographic recording materials are described in a number of references, such as, for example, L. Solymer and D. J. Cook, Volume Holography and Volume Gratings, Academic Press, New York, 1981, Chapter 10, pp 254–304 and J. W. Gladden and R. D. Leighty, in "Recording Media", in Handbook of Optical Holography, H. J. Caufield, ed., Academic Press, New York, 1979, pp 277–298. Preferred recording materials for use in the processes of this invention are photopolymerizable compositions, dichromated gelatin, and silver halide emulsions.

Photopolymerizable compositions are disclosed in Haugh, U.S. Pat. No. 3,658,526; Chandross, U.S. Pat. No. 3,993,485; and Fielding, U.S. Pat. Nos. 4,535,041 and 4,588,664. Preferred photopolymerizable compositions are disclosed in Keys, U.S. Pat. No. 4,942,102; Monroe, U.S. Pat. No. 4,942,112; Smothers, U.S. Pat. No. 4,959,284; and Trout, U.S. Pat. No. 4,963,471. In the preferred compositions either the monomer or the binder has one or more moieties selected from the group consisting of (1) an aromatic moiety selected from the group consisting of (i) substituted or unsubstituted phenyl, (ii) substituted or unsubstituted naphthyl, and (iii) substituted or unsubstituted heterocyclic aromatic moieties having up to three rings; (2) chlorine; (3) bromine, and mixtures thereof; and the other constituents are substantially free of said moiety. Compositions in which the monomer contains the indicated moiety are more preferred.

For systems in which the monomer contains the indicated moiety and the binder is free of the indicated moiety, preferred liquid monomers are: 2-phenoxyethyl acrylate, 2-phenoxyethyl methacrylate, phenol ethoxylate monoacrylate, 2-(p-chlorophenoxy)ethyl acrylate, p-chlorophenyl acrylate, phenyl acrylate, 2-phenylethyl acrylate, 2-(1-naphthyloxy)ethyl acrylate, o-biphenyl methacrylate, o-biphenyl acrylate, ethyl 1-benzoyl-2-vinyl-1-cyclopropane carboxylate and mixtures thereof. Preferred solid monomers, which may be used to advantage in combination with liquid monomers are: N-vinyl carbazole; 2,4,6-tribromophenyl acrylate or methacrylate; pentachlorophenyl acrylate or methacrylate; 2-naphthyl acrylate or methacrylate; 2-(2-naphthyloxy)ethyl acrylate or methacrylate; and mixtures thereof. Preferred binders for use in these systems are: cellulose acetate butyrate; poly(methyl methacrylate); poly(vinyl butyral); poly(vinyl acetate); and fluorine containing binders containing 3 to 25% by weight fluorine, such as copolymers of vinyl acetate with tetrafluoroethylene and/or hexafluoropropylene. For reflection holograms, the preferred binders are poly(vinyl butyral), poly(vinyl acetate), and copolymers of vinyl acetate with tetrafluoroethylene and/or hexafluoropropylene containing 3 to 25% by weight fluorine, such the 82:18 (mole %) vinyl acetate/tetrafluoroethylene copolymer.

For systems in which the binder contains the indicated moiety and the monomer is free of the indicated moiety, preferred monomers are: triethyleneglycol diacrylate and dimethacrylate, diethyleneglycol diacrylate, decanediol diacrylate, ethoxyethoxyethyl acrylate, iso-bornyl acrylate, ethyl 1-acetyl-2-vinyl-1-cyclopropane carboxylate, ethyl 2-vinylcyclopropane-1,1-dicarboxylate and mixtures thereof. Preferred binders for these systems are: polystyrene and copolymers containing at least about 60% styrene. Particularly preferred binders include polystyrene, 75:25 poly(styrene/acrylonitrile), and 70:30 poly(styrene/methyl methacrylate), as well as mixtures thereof.

If crosslinking of the photopolymer is desired, up to about five weight percent of at least one multifunctional monomer containing two or more terminal ethylenically unsaturated groups may be incorporated into the composition. The polyfunctional monomer must be compatible with the other components of the composition and is preferably a liquid. Suitable multifunctional monomers include di-(2-acryloxyethyl)ether of bisphenol A, ethoxylated bisphenol A diacrylate, and the like. Ethoxylated bisphenol A diacrylate is preferred.

The initiator system has one or more compounds that directly furnish free-radicals when activated actinic radiation. By "actinic radiation" is meant radiation that is active to produce the free-radicals necessary to initiate polymerization of the monomeric material. The system may contain a number of compounds, one of which yields the free-radicals after having been caused to do so by a sensitizer activated by the radiation. The photoinitiator system typically contains a photoinitiator and a sensitizer that extends the spectral response of the system to the wavelength of the actinic radiation, typically the visible or near infrared spectral region.

A large number of conventional initiator systems may be used. Photoreducible dyes and reducing agents; ketones; quinones; dye-borate complexes as disclosed in U.S. Pat. No. 4,772,541; and trichloromethyl triazines as disclosed in U.S. Pat. Nos. 4,772,534 and 4,774,163 can be used to initiate photopolymerization. A useful discussion of dye sensitized photopolymerization is "Dye Sensitized Photopolymerization" by D. F. Eaton in Adv. in Photochemistry, Vol. 13, D. H. Volman, G. S. Hammond, and K. Gollinick, eds., Wiley-Interscience, New York, 1986, pp. 427-487.

Preferred initiator systems are 2,4,5-triphenylimidazolyl dimers. These compounds are disclosed in: Chambers, U.S. Pat. No. 3,479,185; Cescon, U.S. Pat. No. 3,784,557; Dessauer, U.S. Pat. No. 4,311,783; and Sheets, U.S. Pat. No. 4,622,286. Preferred 2,4,5-triphenylimidazolyl dimers include CDM-HABI, i.e., 2-(o-chlorophenyl)-4,5-bis(m-methoxyphenyl)-imidazole dimer; o-Cl-HABI, i.e., 1,1'-biimidazole, 2,2'-bis(o-chlorophenyl)-4,4'5,5'-tetraphenyl-; and TCTM-HABI, i.e., 1H-imidazole, 2,5-bis(o-chlorophenyl)-4-[3,4-dimethoxyphenyl]-, dimer, each of which is typically used with a hydrogen donor.

A preferred group of sensitizers include those disclosed in: Baum and Henry, U.S. Pat. No. 3,652,275; Dueber, U.S. Pat. No. 4,162,162; Smothers, U.S. Pat. No. 4,917,977; and Monroe, U.S. patent application No. 7/447,721, filed Dec. 8, 1989. Particularly preferred sensitizers include the following: DEAW, i.e., cyclopentanone, 2,5-bis[4-(diethylamino)phenyl]methylene]-, CAS 38394-53-5; JAW, i.e., cyclopentanone, 2,5-bis[(2,3,6,7-tetrahydro-1H,5H-benzo[i,j]quinolizin-1-yl)methylene]-; cyclopentanone, 2,5-bis[2-(1,3-dihydro-1,3,3-trimethyl-2H-indol-2-ylidene)ethylidene], CAS 27713-85-5; and cyclopentanone, 2,5-bis-[2-ethylnaphtho[1,2-d]thiazol-2(1H)-ylidene)ethylidene], CAS 27714-25-6.

Suitable hydrogen donors include: 2-mercaptobenzoxazole, 2-mercaptobenzothiazole, 4-methyl-4H-1,2,4,triazole-3-thiol, and the like. Other suitable hydrogen donor compounds, which are preferred for compositions which contain N-vinyl carbazole monomer, are 5-chloro-2-mercaptobenzothiazole; 2-mercaptobenzothiazole; 1H-1,2,4-triazole-3-thiol; 6-thoxy-2-mercaptobenzothiazole; 4-methyl-4H-1,2,4-triazole-3-thiol; 1-dodecanethiol; and mixtures thereof.

Other components conventionally added to photopolymer compositions can be present to modify the physical properties of the recording medium, provided they are compatible with the composition and do not adversely affect the properties of the recording medium or the resulting hologram. Such components include: plasticizers, thermal stabilizers, optical brighteners, ultraviolet radiation absorbing material, adhesion modifiers, coating aids, and release agents.

The compositions used in the preferred recording element are dry films, and are used as a layer applied to a dimensionally stable support. The composition may be directly coated onto the support by any conventional method, or may be cast as a film and laminated to the support by conventional methods. In either case the support generally provides only temporary dimensional stability for the photopolymer film prior to mounting on a substrate, and thus the support is releasable from the film. If the recording medium is to be irradiated through the support, the support must be transparent to actinic radiation. For some applications, however, it may be desired to retain the support as a permanent overcoat or protective layer for the photopolymer film, in which case the support and the photopolymer film may be permanently bonded. A preferred support material is polyethylene terephthalate film.

For applications in which a hologram mounted on an opaque substrate is required, it may be desirable for the diffusion element support to be an opaque or black film. The support then may be left in place following exposure to serve as opaque substrate, or backing, for the hologram. It is then unnecessary to remove the support and mount the hologram on an opaque substrate. When an opaque support is used, the film element is most readily irradiated through the coversheet before lamination of the diffusion element to the recording medium. Preferred opaque backings are polymer films filled with pigments, such as, for example, carbon black. Carbon black filled polyethylene terephthalate film is preferred.

The other side of the supported photopolymerizable layer may have a temporary release film or coversheet such as polyethylene, polypropylene, polyethylene terephthalate, or the like. Conventional intermediate layers or coatings may be used to facilitate the adhesive and/or release characteristics needed for the preformed film.

Typically the coversheet is removed, and the photopolymerizable layer mounted on a substrate prior to exposure. The support may remain in place, acting as a coversheet, during exposure. Exemplary transparent substrates which may be selected to advantage include: glass, polyethylene terephthalate film, poly(methyl methacrylate), polycarbonate, and cellulose triacetate.

In the preparation of reflection holograms from the preferred photopolymerizable compositions, the hologram is fixed by a second, overall exposure to actinic radiation. If the binder is poly(vinyl butyral), poly(vinyl acetate), or a copolymer of vinyl acetate with tetrafluoroethylene and/or hexafluoropropylene containing 3 to 25% by weight fluorine, the refractive index modulation of the hologram can be enhanced by heating to 100°–150° C. for about 0.5–1.5 hr following overall exposure.

Exposure of the Elements

Any convenient light source that provides actinic radiation of appropriate wavelength and intensity to initiate photopolymerization may be used to expose the diffusion element. The radiation can be natural or artificial, monochromatic or polychromatic, incoherent or coherent. For efficient image formation most of the actinic radiation should be absorbed by the photoinitiator system. Conventional source of actinic radiation include fluorescent, mercury vapor, mercury-xenon, metal additive, and arc lamps. Useful sources of coherent radiation are lasers whose emissions fall within or overlap the absorption bands of the initiator system. Imagewise exposure may be carried out through an imagebearing transparency, preferably a half-tone or continuous tone color separation transparency. However, other means, such as a modulated scanning laser beam, CRT (cathode ray tube), and the like, are alternative ways of imagewise exposing the diffusion element.

For the exposure of holographic recording element coherent light sources, i.e., lasers, are required. To image photopolymerizable compositions that are sensitized across the visible spectrum, tunable lasers may be used that match the broad spectral sensitivity of these materials.

Industrial Applicability

This invention is used to prepare volume phase reflection holograms. Reflection holograms can be used as holographic optical elements such as head-up displays and holographic notch filters. Reflection holograms also are suited for use in displays such as in advertising or packaging; in security applications such as credit cards, bank notes, lottery tickets, stock certificates, bonds, airline tickets, and the like; and for information storage. Other specific uses for reflection holograms will be evident to those skilled in the art.

The following examples which illustrate, but do not limit, the invention.

EXAMPLES

| | EXAMPLES GLOSSARY |
|---|---|
| FC-430 | Fluorad ® FC-430, fluorinated nonionic surfactant; CAS 11114-17-3; 3M Company, St. Paul, MN |
| JAW | Cyclopentanone, 2,5-bis[2,3,6,7-tetrahydro-1H,5H-benzo[i,j]quinolizin-9-yl)methylene]- |
| MMT | 4-Methyl-4H-1,2,4-triazole-3-thiol; CAS 24854-43-1 |
| NVC | N-Vinyl carbazole; 9-vinyl carbazole; CAS 1484-13-5 |
| o-Cl-HABI | 1,1'-Biimidazole, 2,2'-bis[o-chlorophenyl]-4,4',5,5'-tetraphenyl-; CAS 1707-68-2 |
| Isopar ® L | Branched-chain aliphatic hydrocarbons, b.p. 188–206° C.; Exxon Corporation, Houston, TX |
| Photomer ® 4039 | Phenol ethoxylate monoacrylate; CAS 56641-05-5; Henkel Process Chemical Company, Ambler, PA |
| Poly(VAc/TFE) | 77:23 Poly(vinylacetate/tetrafluoroethylene) |
| Sartomer 349 | Ethoxylated bisphenol A diacrylate; CAS 24447-78-7; Sartomer Company, West Chester, PA |
| Vinac ® B-100 | Poly(vinylacetate); M.W. 350,000; CAS 9003-20-7 Air Products |

EXAMPLE 1

To prepare the holographic recording film, a coating solution was prepared containing Vinac ® B-100 (66% by weight of total solids); MMT (2.1)%; Photomer ® 4039 (17%); Sartomer 349 (3%); N-vinylcarbazole (7.9%); o-Cl HABI (3.7%); JAW (0.07%); and Fluorad ® FC-430 (0.22%) in 19:1 dichloromethane/methanol. The solution was extrusion dye coated onto a support of 50 micron clear polyethylene terephthalate film at a speed of 31 ft/min (15 cm/sec) using a web coater. The solvent was evaporated by passing the coated film through a three zone drier. The first zone was at 120° F. (49° C.), the second at 140° F. (60° C.), and the third at 160° F. (71° C.). A coversheet of 23 micron polyethylene terephthalate film was laminated to the coating as it exited the drier. Dry coating thickness was 24 microns.

To prepare the tuning film, a coating solution containing Vinac ® B-100 (65.8% by weight total solids); Photomer ® 4039 (28%); Sartomer 349 (3.0%); o-Cl HABI (1.5%); MMT (1.5%) and Fluorad ® FC-430 (0.2%) in 19:1 dichloromethane/methanol was prepared and coated as described above to produce an element consisting of: coversheet, coating, and polyethylene terephthalate film support.

The holographic recording film was cut into an about 10×13 cm sections. The coversheet was removed, and the film mounted onto a clear glass plate by laminating the exposed tacky coating directly onto the plate. The film support was left in place during the subsequent handling, exposure, and thermal processing steps.

The glass plate bearing the sample of holographic recording film was tightly clamped between a glass plate bearing a zero degree antireflection coating and a front-surface aluminum mirror with thin layers of Isopar ® L between the glass plate bearing the antireflection coating and the glass plate bearing the sample, between the glass plate bearing the sample and the mirror. Holographic mirrors were formed by exposing with a collimated laser beam oriented perpendicular to the film plane and passing, in order, through the glass plate bearing the antireflection coating, Isopar ® layer, film support, coating, glass plate bearing the sample, and Isopar ® layer and then reflecting back onto itself off the mirror. Imaging conditions were: 40 mJ/cm$^2$ at 528.7 nm using an argon-ion laser, 20X objective, and 15 micron pinhole.

After the holographic mirror had been recorded in the holographic film, the aluminum mirror and Isopar ® layers were removed. The imaged film was overall exposed to ultraviolet and visible light from a Theimer-Strahler #5027 mercury-arc photopolymer lamp (Exposure Systems Corp., Bridgeport, Conn.) mounted in a Douthitt DCOP-X exposure unit (Douthitt Corp., Detroit, Mich.) for 120 sec (about 150 mJ/cm$^2$). The film was thermally processed by heating at 100° C. for about 30 min in a forced-air convection oven.

The film support was removed from the imaged and exposed film containing the holographic mirror. The coversheet was removed from the color tuning film and the uncovered surface of the color tuning film laminated to the uncovered surface of the imaged and exposed coating to form an element consisting of: glass plate, imaged and exposed holographic photopolymer coating containing the holographic mirror, color tuning film coating, and color tuning film support. The element was exposed in the Douthitt DCOP-X exposure unit with the color tuning film support facing the light source. Different regions of the element were irradiated for different lengths of time.

The element was thermally processed by heating at 100° C. for about 30 min in a forced-air convection oven. The transmission spectrum of each region of the holographic mirror was recorded using a standard double-beam scanning spectrophotometer (Perkin Elmer model Lambda-9) with the sample beam oriented perpendicular to the hologram film plane. The results are shown in Table 1.

TABLE 1

| Exposure Time (sec)$^a$ | $\lambda_{max}$ (nm) |
|---|---|
| 0 | 583.8 |
| 5 | 565.9 |
| 10 | 537.2 |
| 15 | 526.3 |
| 20 | 523.7 |
| 25 | 520.6 |

$^a$Time the color tuning film was exposed following lamination to the hologram.

EXAMPLE 2

The procedure of Example 1 was repeated except that the coating solution for the holographic recording film contained Poly(VAc/TFE) (66% by weight of total solids); MMT (2.1)%; Photomer ® 4039 (17%); Sartomer 349 (3%); N-vinylcarbazole (7.9%); o-Cl HABI (3.7%); JAW (0.078%); and Fluorad ® FC-430 (0.22%). The results are given in Table 2.

TABLE 2

| Exposure Time (sec)$^a$ | $\lambda_{max}$ (nm) |
|---|---|
| 0 | 567.0 |
| 5 | 542.9 |
| 10 | 518.5 |
| 15 | 511.2 |
| 20 | 507.8 |
| 25 | 507.9 |

$^a$Time the color tuning film was exposed following lamination to the hologram.

EXAMPLE 3

The procedure of Example 1 was repeated except that the front surface mirror was replaced by a dichromated gelatin hologram master of a graphic arts image. The master was copied by exposing the film at 57° at 514 nm with 40 mJ laser energy. The resulting hologram was observed under broad-band visible incoherent radiation at 45°. Observed colors are given in Table 3.

TABLE 3

| Exposure Time (sec)$^a$ | Color |
|---|---|
| 0 | orange-gold |
| 5 | yellow-gold |
| 10 | yellow-green |
| 15 | green |
| 20 | green |

$^a$Time the color tuning film was exposed following lamination to the hologram.

EXAMPLE 4

The procedure of Example 3 was repeated except that the holographic photopolymer film prepared in Example 2 was used in place of the film prepared in Example 1. Observed colors are given in Table 4.

TABLE 4

| Exposure Time (sec)$^a$ | Color |
|---|---|
| 0 | deep red |
| 5 | red |
| 10 | yellow-green |
| 15 | green |
| 20 | green |

$^a$Time the color tuning film was exposed following lamination to the hologram.

EXAMPLE 5

The procedure of Example 1 was followed except that the film was laminated to a the surface of a glass plate bearing a dichromated gelatin hologram master on the opposite surface to produce an element consisting of: film support, photopolymer coating, glass plate, and dichromated gelatin hologram master. The master was copied by exposing the film at 58° at 514 nm with 40 mJ laser energy. The beam passes through the base, the photopolymer coating, and the glass plate into the master which reflects it back through the glass plate into the photopolymer layer.

The imaged element overall exposed to ultraviolet and visible radiation as in Example 1, and the glass plate bearing the hologram master removed. The color tuning film of Example 1 was laminated to the exposed film to prepare an element consisting of: holographic photopolymer film support, imaged and exposed photopolymer coating, color tuning film coating, and color tuning film support.

Two silver halide masks were aligned on top of the color tuning film support. The first mask contained line art text and a vignette of increasing halftone dot density with dot density increasing continuously from left to right. The second mask had line art text only. Each mask masked different portions of the color tuning film. The color tuning film was overall exposed through the masks for 60 sec as described in Example 1. The second mask was removed and the color tuning film was overall exposed through the first mask only for an additional 3 sec. This exposure fully cures the regions of the color tuning film not covered by the patterning on the masks and partially cures the regions under the second mask but not under the first mask. The element consisting of holographic film support, imaged and exposed photopolymer coating, imagewise exposed color tuning film coating, and imagewise exposed color tuning film support was heated at 100° C. for 30 min as described in Example 1.

The color tuning film was removed and the hologram observed under broad-band visible incoherent radiation at normal incidence with the lamp at the proper reconstruction angle. The regions of the hologram in contact with the regions of the color tuning film which were not masked were green. The regions of the hologram in contact with the regions of the color tuning film covered by the second mask were gold. The regions of the hologram in contact with the regions of the color tuning film which were covered by the first mask were red. A gradient in color from red to green was observed in the region of the hologram in contact with the regions of the color tuning film covered by the vignette halftone region.

EXAMPLE 6

This example describes a process whereby a three-color hologram may be prepared in a preferred holographic recording material.

A holographic recording material, such as was used in Example 1 or Example 2, is imaged in a manner to produce a blue reflection hologram. This may be done, for example, by copying a reflection master hologram, such as was done in Example 5, using a blue laser line, such as the 457 nm or 476 nm line of the argon-ion laser, at normal incidence. The imaged recording medium is then overall exposed to ultraviolet and visible light as described in Example 1.

The imaged and overall exposed recording medium containing the hologram is removed from the glass. The coversheet of a color tuning film, such as was described in Example 1, and the revealed surface of the color tuning film laminated to the imaged and overall exposed recording medium. Immediately following lamination, the color tuning film is imagewise exposed to actinic radiation through a photomask which is transparent where blue is desired in the final hologram and opaque elsewhere.

A second photomask, which is transparent where green is desired in the final hologram and opaque elsewhere, is aligned on the diffusion element. After an appropriate amount of diffusion has taken place to shift the response wavelength of the regions of the hologram in contact with the unexposed regions of the diffusion element from blue to green, exposure is carried out through the second photomask. The time necessary for this diffusion, which will depend on the nature and composition of both the diffusion element and the recording medium as well as the temperature, can be determined experimentally. The element made up of the recording medium containing the hologram and the laminated diffusion element is then thermally processed as described in Example 1 to produce a three-color hologram containing the laminated diffusion element as a protective layer.

Having described the invention, we now claim the following and their equivalents.

What is claimed is:

1. A process for forming a multicolor volume phase hologram in a substantially solid, transparent, photosensitive film element comprising:
    (a) holographically exposing said film element to coherent light to record a volume hologram within said element;
    (b) imagewise exposing a solid diffusing element containing monomer to actinic radiation to partially polymerize said monomer;
    (c) contacting said film element with said diffusion element for at time sufficient to selectively modify the wavelength of light response by the hologram by the diffusion of monomer from said diffusion element, thereby forming a multicolor hologram, and
    (d) polymerizing the monomer that has diffused into said film element during step (c).

2. The process of claim 1 wherein said film element is in contact with said diffusion element at the time of the step (b) exposure.

3. The process of claim 1 wherein the exposed film and diffusion elements of steps (a) and (b) are brought into contact in step (c).

4. The process of claim 1 wherein the exposure of step (b) is through a half-tone screen.

5. The process of claim 1 wherein the exposure of step (b) is through a transmissive device.

6. The process of claim 1 wherein the exposure of step (b) is accomplished using a scanning laser or electron beam.

7. The process of claim 1 wherein said diffusion element is removed from said film element after step (c).

8. The process of claim 1 wherein said diffusion element remains on said film element after step (c) to serve as a backing.

9. The process of claim 1 wherein said film element comprises a photopolymerizable composition, dichromated gelatin, or silver halide emulsion coated on a support.

10. The process of claim 1 wherein said film element comprises a support that bears a composition comprising a photopolymerizable monomer, a binder, and an initiator system, and wherein either said monomer or said binder comprises one or more moieties selected from the group consisting of (1) an aromatic moiety selected from the group consisting of (i) substituted or unsubstituted phenyl, (ii) substituted or unsubstituted naphthyl, and (iii) substituted or unsubstituted heterocyclic aromatic moieties having up to three rings; (2) chlorine; (3) bromine, and mixtures thereof; and the other constituent is substantially free of said moiety.

11. The process of claim 1 wherein said diffusion element has an opaque support.

* * * * *